Nov. 5, 1968 F. C. BECKER 3,409,761
COUNTER
Filed Oct. 7, 1965 2 Sheets-Sheet 1

INVENTOR.
FREDERICK C. BECKER.
BY
Gerald R. Hibnick
ATTORNEY.

INVENTOR.
FREDERICK C. BECKER.
BY
Gerald R. Hibnick
ATTORNEY.

United States Patent Office 3,409,761
Patented Nov. 5, 1968

3,409,761
COUNTER

Frederick C. Becker, Dearborn Heights, Mich., assignor to Burroughs Corporation, Detroit, Mich., a corporation of Michigan Filed Oct. 7, 1965, Ser. No. 493,729
19 Claims. (Cl. 235—92)

This invention relates to digital counters and more particularly to an electronic counter having three different types of sections, each housing a different form of bistable device. The sections of the counter are intercoupled in a novel manner to enable counting in a plurality of radices and to provide a non-slivering output upon reaching the selected base count as well as a predetermined plurality of prior counts.

Heretofore counter circuits have been designd which couple bistable devices in cascade and which also selectivly feed back the outputs from some of these devices to provide multistage binary counters and also to enable counting in a particular radix, such as decimal. A disadvantage of such type of counter circuits is that in order to derive a discrete output at its maximum count and at other near maximum count positions, the outputs of several bistable devices must be gated together. Since the cascaded bistable devices switch from one stable state to another at slightly different times and, while doing so, generate undesired transient signals, these transients can cause an erroneously gated output signal when in fact the count represented thereby does not exist. This switching characteristic is sometimes called "slivering."

Another drawback of many electronic counters is that their design lacks flexibility due to the use of a single form of bistable device. For this reason, it is difficult to convert a counter having one radix or maximum count to another radix. Moreover, it is a considerable problem to design therefrom a counter operably switchable to different radices.

Accordingly, it is a primary object of this invention to provide an improved electronic counter employing a plurality of different forms of bistable devices.

Another object of this invention is to provide an electronic counter having a binary section coupled to two nonbinary sections to produce nonbinary output signals.

Another object of this invention is to provide an electronic counter which obviates slivering at the maximum counter output and a preselected number of adjacent count positions.

Another object of this invention is to provide an electronic counter that is cyclical, in that the maximum and zero count positions are logically the same, and these positions are represented by the unique state of a single bistable device.

Another object of this invention is to provide a logically flexible electronic counter operable in an infinite number of bases.

A further object of this invention is to provide an electronic counter operably switchable from one radix to another.

The foregoing objects are attained by my inventive counting circuit described hereinafter in which a basic configuration comprises a binary input section having at least one complementing bistable device, an interface section having one set-reset bistable device, and an output section having at least one shift register bistable device. These sections are serially coupled. An output from the output section is fed back to reset the interface section, the latter two sections are coupled back to the binary section via an input gate to which are applied pulses to be counted, and the count pulses are also directly coupled to the output section.

A second form of my counter comprises in addition to the basic sections, input gate, and intercouplings, one or more supplemental pairs of interconnected interface and output sections which are interposed between the basic interface and output sections. On demand input steering means is also provided in this form of counter to bypass or selectively insert one of the supplemental pairs of sections into the counting sequence to thereby selectively change the radix of the counter.

In both forms of my digital counter, count representing outputs are obtainable directly, uniquely, and therefore without slivering from the bistable devices in the interface and output sections.

Other objects and advantages of the invention will become apparent from a consideration of the following specification and claims taken in conjunction with the accompanying drawings in which:

Figure 1:
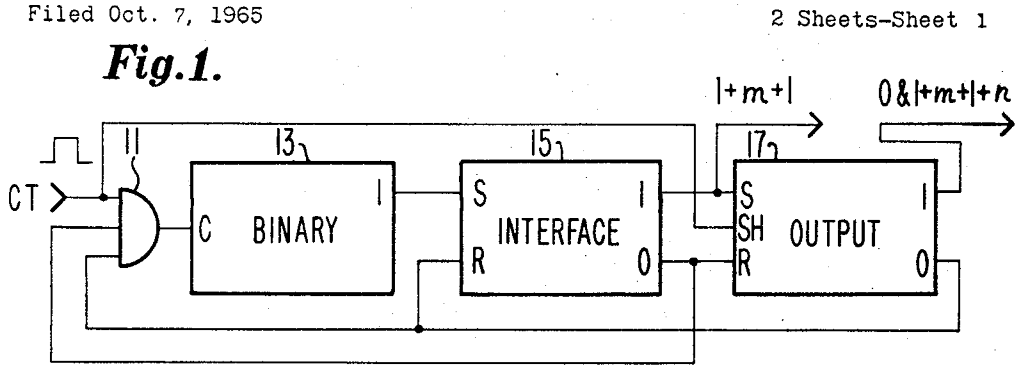
FIG. 1 is a logic diagram of the basic counter circuit of this invention.

As shown in FIG. 1, the subject counter comprises a primary input AND gate 11, having a count input CT which receives the pulses to be counted. For convenience, the pulses to be counted will be considered substantially square and having a voltage excursion between ground and a sufficiently positive value such that upon the trailing edge of a count pulse there is an adequate change of energy to trigger one or more of the bistable devices next to be described.

Figure 2:
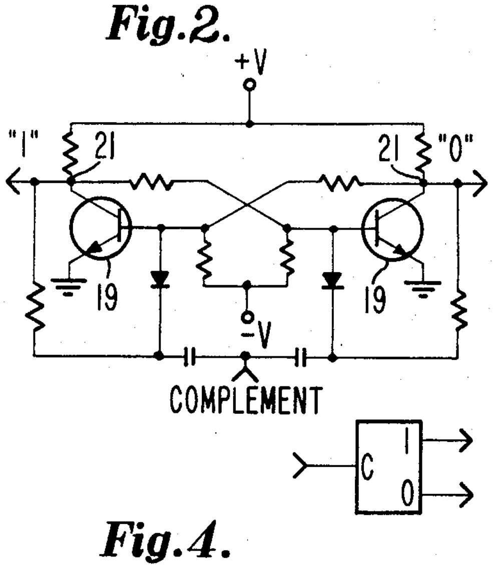
FIG. 2 illustrates a schematic and a logic drawing of a typical complementing bistable device.

The output from the AND gate 11 is directly coupled to the input of an input counting section 13 which preferably is in the form of a binary counter comprising one or more complementing bistable devices, an example of which is shown schematically and logically in FIG. 2. Whenever more than one of the complementing devices are employed in the binary section 13, these devices are serially coupled with the "1" output of one device coupled to the complementing input of the next.

The "1" output from the binary section 13, which would be the "1" output from the last complementing device in that section, is coupled to a basic interface section 15 via its set input S, as shown in FIG. 1. The interface section 15 comprises one bistable device of the set-reset form, an example of which is set forth schematically and logically in FIG. 3.

Figure 4:
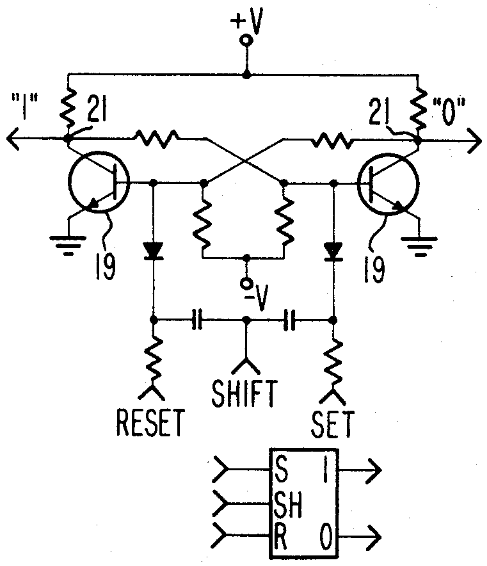
FIG. 4 illustrates a schematic and a logic drawing of a typical shift register bistable device.

The "1" and "0" outputs of the interface section are coupled respectively to the set, S, and reset, R, inputs of a basic output section 17 which comprises one or more shift register bistable devices, an example of which is shown schematically and logically in FIG. 4. The output section 17 has a shift input SH which, as shown in FIG. 1, is directly coupled to the count input line CT. Whenever the output section contains more than one adjacent shift register bistacle device, these devices are serially coupled with the "1" and "0" outputs of each device connected respectively to the S and R inputs of the next device. The SH input of each is coupled to the CT line.

Figure 3:
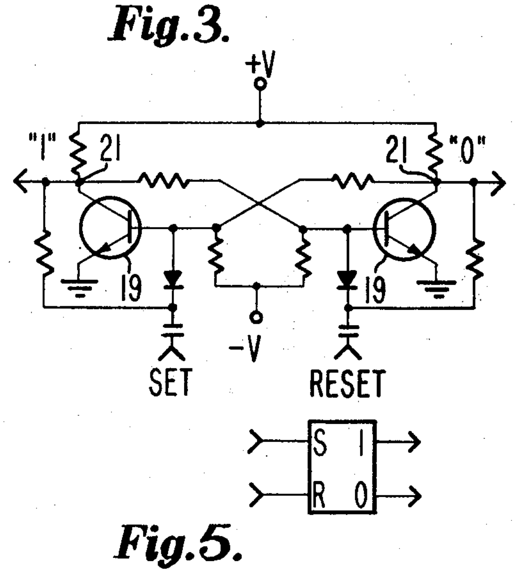
FIG. 3 illustrates a schematic and a logic drawing of a typical set-reset bistable device.

Before discussing other interconnection between the primary input AND gate and the sections of the subject counter, as shown in FIG. 1, and explaining the counter operation, the three forms of bistable devices shown in FIGS. 2, 3 and 4 will be commented upon briefly.

Each of these bistable devices, or flip flops as they are commonly called, are so well known in the art that the internal contents and operation of each need not be detailed herein. It will be noted however that all three circuits are trailing edge sensitive; i.e., under proper conditions each is triggered to change from one state to the other upon receipt of the negative directed or trailing edge of a positive pulse.

As used herein, the "1" output of any particular bistable device is high; i.e., transmitting a voltage level substantially above ground, whenever the device is in the set condition. This condition is equivalent to the binary designation (1). When the device is reset, the "0" output is high and may be represented by the binary (0). In the above two conditions, the "0" and "1" outputs are respectively at ground or zero potential.

In particular, the complementing device, shown in FIG. 2 changes to the opposite state, either (1) or (0), upon receipt of the trailing edge of a pulse at its complement input C, regardless of the pre-existing state or condition of the device. However, the set-reset device, shown in FIG. 3, changes to the (1) state upon the receipt of the trailing edge of a pulse to its set input S if the device is at that time in the (0) condition. Similarly, the set-reset device is reset by the trailing edge of a pulse into its R input only if at that time it is in the (1) state. A pulse into the S or R input when the device is respectively in the set or reset condition has no effect upon its "1" and "0" outputs.

The shift register device, shown in FIG. 4, requires a combination of input conditions at its S and R terminals as well as the coincidence of the trailing edge of an input pulse to its SH input to cause a change of state. For example, to switch that device from (0) to (1), a high level must be applied to its S input and a low or ground level to its R input coincident with the trailing edge of a count pulse into its SH input.

In FIGS. 2–4, each transistor 19 is normally driven into conduction by the application of a positive potential to its base. Thereupon, a junction 21, between the collector and the output, becomes effectively grounded. In a corresponding manner, the application of ground potential to the junction 21 causes its associated transistor to become conductive. The first mentioned mode of operation is employed to set and reset each bistable device via a count pulse as previously discussed. The second mentioned mode of causing any particular transistor to conduct is employed in initially presetting the bistacle devices in the counter. To preset a bistable device to (0), the transistor coupled to the junction 21 adjacent its "1" output is made conductive by grounding its collector. A device is preset to (1) by grounding the collector of the transistor 19 adjacent the "0" output.

Figure 5:
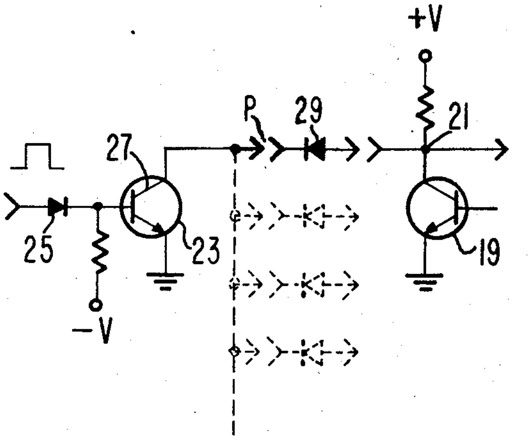
FIG. 5 is a schematic drawing of a pullover or bistable device presetting circuit.

FIG. 5 illustrates one type of circuit which could be employed for pulling the collector over to ground. Other types of "pullover" circuits could also be employed, depending upon the form of bistable devices utilized. As shown in FIG. 5, a presetting pulse is applied to the base of a transistor 23 via a then forward biased diode 25. The transistor 23 thereupon becomes conductive, clamping its collector 27 and thereby an output P coupled thereto to ground. The pullover output P is connected to a plurality of parallel coupled diodes 29, one for each bistable device of interest. The application of ground potential to output P forward biases all the diodes 29 and thereby pulls to ground each junction point 21 coupled thereto to effect the desired presetting of the counter.

Obviously, an array of pullover diodes could be coupled to the counter via a plurality of discrete inputs to enable selectable presetting to any desired initial count position.

A preferred circuit arrangement for presetting a counter into the zero count position is to couple the pullover circuit to the "1" output of each of the bistable devices to set each to (0), except for the pullover diode associated with the bistable device in the basic output section 17. The pullover circuit is coupled to the (0) output of the latter to preset it to (1). The reason for this choice of presetting will become apparent during the subsequent discussion of the operation of the counter.

As hereinafter employed, the terms "complementing," "set-reset," and "shift register" or their equivalents refer to forms of bistable devices having the switching characteristics above outlined. The circuits shown in FIGS. 2–4 as well as FIG. 5 are only for purposes of example and are not to be considered limitations upon the descriptive terminology.

With reference again to FIG. 1 and the basic configuration of the subject counter, it will be seen that the "0" outputs from the interface section 15 and the output section 17 are discretely fed back to the AND gate 11. Because of this coupling, whenever the bistable devices associated with either one or both of these outputs are in the set or (1) condition, a low signal is fed back to the AND gate and inhibits the transmission of count pulses through the gate and into the binary section 13.

The "0" output from the output section 17 is also coupled to the reset input of the interface section 15. Accordingly, upon the setting of the shift register device associated with that "0" output, that output voltage of section 17 changes from high to low and effects an input to the interface section which resets the set-reset device directly associated with the R input, if the latter device were previously in the set condition.

In the following described counter operation reference will be made to both FIG. 1 and Table I set forth below. It will be recalled that primary objects of the subject counter are flexibility in the radix, the formation of non-slivering outputs, and a cyclical mode of operation. Variations in the number of bistable devices in the input section 13 and the output section 17 enable flexibility in radix determination. The slivering of outputs is obviated by taking each distinct numeric output directly from a discrete bistable device in the interface section 15 or the output section 17. To accomplish the latter, only that discrete bistable device should change state in response to the application of that output representing count pulse. The cyclical mode of operation is accomplished by the novel gating and feed back couplings and also the initial or zero count presetting of the counter to a unique condition which is logically the same as the maximum or radix count position.

TABLE I

| Pulse Count | Counter Section | | |
|---|---|---|---|
| | Binary | Inter face | Output |
| 0 | 0 | 0 | 1 |
| 1 | 0 | 0 | 0 |
| 2 | 1 | 0 | 0 |
| 1+m | 1 | 0 | 0 |
| 1+m+1 | 0 | 1 | 0 |
| 1+m+2 | 0 | 0 | 1 |
| 1+m+1+n | 0 | 0 | 1 |

In the initial or zero count status, all the bistable devices in the input and basic interface sections 13 and 15 are in the (0) state. If there is only one shift register device in the basic output section 17, it is in the (1) state. If there is a plurality of such devices in section 17, the last in the series is in the (1) state and the remainder are in the (0) state. This initial status is attained by the presetting pullover method previously discussed or, because at the end of the previous counting cycle the counter had reached its radix status, which is logically the same as the zero count status. Thus, in the preset or zero count condition, only the output section has a bistable device that is set and its "1" output line is the only high output from the circuit, as shown in Table I.

Upon the application of the first count pulse, the AND gate 11 is blocked, because the "0" output from the output section 17 is low. However, the trailing edge of that pulse, which is applied to the SH input of each shift register device in the output section, is effective in resetting to (0) the serially last bistable device in that section, since at that time the R and S inputs to that device are high and low respectively due to the output conditions of the preceding bistable device. The other bistable devices in the section 17 remain in the (0) state since their S and R inputs are also low and high respectively. Accordingly, all sections now have attained the reset (0) condition as shown on line two of Table I.

Since the "0" output from each device in the interface and output sections is high prior to the application of the second count pulse to the input AND gate 11, these outputs no longer inhibit that gate. Accordingly, the second pulse to be counted is coupled from the CT line to the complement input of the binary input section 13 so that the trailing edge of that second pulse causes the serially first complementing device in section 13 to be set to (1). If there is only one complementing device in the input section, this section becomes filled upon the receipt of the second count pulse, as shown in Table I.

Although the trailing edge of the second pulse is applied to the SH input of each shift register device in the output section 17, none of these devices are able to change state due to the adverse conditioning of their S and R inputs.

If there are several complementing devices in the binary section 13, an $m$ quantity of counting pulses applied to the AND gate is receivable by that input section until all of its complementing bistable devices attain the (1) condition. As used herein, $m$ represents the binary maximum of the stages in the section 13. If the input section 13 is other than binary, it is to be assumed that it also can store an $m$ quantity of pulses. Since the first count pulse is not applied to the input section, that section becomes filled at the count of $1+m$, as shown on the fourth line of Table I.

The manner by which a train of count pulses progressively sets and resets serially coupled bistable devices of the forms employable in my counter is so well known by those skilled in the art that a detailed explanation thereof is not herein included.

The next pulse through the AND gate has the numeric value of $1+m+1$ and causes all of the stages in the input section to be reset to (0). As a result, a trailing edge from the "1" output of the input section is generated and coupled to the S input of the interface section 15. Such an input causes the set-reset device therein to be set to (1) as indicated on the fifth line of Table I.

Once set, the interface section produces a low signal from its "0" output which is applied to the AND gate 11 to block the next count pulse from being transmitted through that gate. The setting of the interface section 15 also preconditions the S and R inputs of the output section 17 high and low respectively, such that it, or the serially first shift register device therein if there is a plurality, is set upon receipt of the trailing edge of the $1+m+2$ count pulse.

If there is only one shift register device in the output section, upon its attaining the (1) state, its "0" output, which is coupled back to the R input of the interface section, goes low and causes the resetting of the interface section. The low "0" signal from the output section is also coupled to the AND gate 11 to continue its blocked status. This $1+m+2$ counter section condition is shown on line six of Table I.

If there is a plurality of serially coupled shift register type bistable devices in the output section 17, an $n$ quantity of count pulses can be applied thereto and, in a manner well known in the art, each stage is sequentially set while the others are reset or held in the reset state. As employed herein, $n$ equals the sum of the shift register devices in the output section. At all times during the application of the $n$ quantity of pulses to be counted, at least one of the "0" outputs in section 17 is low; therefore, the AND gate remains blocked and the binary and interface sections continue in the (0) state. Accordingly, upon the termination of the count pulse having the digital value of $1+m+1+n$, only the serially last bistable device in the output section is in the (1) state. This condition, as shown on line seven of Table I, represents the maximum capacity, radix, or base of the counter.

A comparison of lines one and seven of Table I readily verifies that the zero count or preferred preset condition of the counter is logically the same as the maximum count condition; thus, the subject counter attains the objective of operating in a cyclical mode.

As shown in FIG. 1, the $1+m+1$ count representing signal can be obtained directly from the "1" output of the interface section 15. Also, the zero as well as the $1+m+1+n$ count signal can be taken directly from the "1" output of the output section 17. If there is only one bistable device in the output section, the $1+m+1+n$ count is equal to $1+m+2$ and thus is one count above the $1+m+1$ count output from the interface section. Such counting relationship will become more apparent in the following discussion of the counter embodied in FIG. 6.

If there are several serially coupled shift register devices in the output section, a discrete count representing output may be taken from each. In this manner it is possible to have non-slivering outputs for each count pulse between and including $1+m+1$ and $1+m+1+n$. The subsequent discussion of the embodiment in FIG. 7 will further define this logical relationship.

It now should be apparent to those skilled in the art that by varying the number of bistable stages in the input and output sections, the subject counter can be designed to operate in any one of an infinite number of radices. Also, the number of stages in the output section controls the available number of sequential count representing outputs between $1+m+1$ and the radix $1+m+1+n$.

Figure 6:
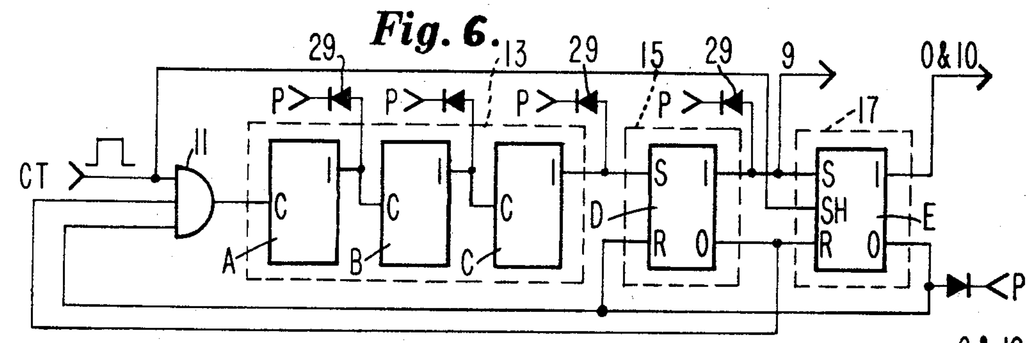
FIG. 6 is a logic diagram of the subject counter in a base ten configuration.

With reference to FIG. 6, there is illustrated an embodiment of the subject counter having a radix of ten. Each of the bistable devices in this embodiment is separately shown in solid lines and grouped into the three sections 13, 15, and 17 by dashed lines. The input section 13 comprises three complementing bistable devices A, B, and C providing a binary section; the interface section 15 contains a set-reset device D; and the output section 17 houses a shift register device E.

The inputs to the AND gate 11 are coupled to a source of count pulses, not shown, as well as to the "0" outputs of sections 15 and 17 in the same manner as the AND gate 11 in FIG. 1. The count pulses are also directly coupled to the SH input of the bistable device E. The output of the AND gate is connected to the input of the bistable device A in section 13. Therefore, the counter embodiment of FIG. 6 operates to selectively couple the pulses to be counted to the bistable devices A–E which comprise the sections 13, 15, and 17 in the same manner as previously described with reference to the basic configuration of my counter shown in FIG. 1.

Table II, set forth below, depicts the state of each bistable device A–E as the counter of FIG. 6 is advanced from zero to nine and then back to zero; the latter being the same as the radix or base count of ten. Reference to this table shows clearly that at the base count of ten and at the next preceding count of nine, discrete and direct outputs can be taken from the bistable devices E and D respectively without need of special gating and without fear of error producing slivering.

TABLE II

| Pulse Count | Counter Section | | | | |
|---|---|---|---|---|---|
| | Binary | | | Interface | Output |
| | A | B | C | D | E |
| 0 | 0 | 0 | 0 | 0 | 1 |
| 1 | 0 | 0 | 0 | 0 | 0 |
| 2 | 1 | 0 | 0 | 0 | 0 |
| 3 | 0 | 1 | 0 | 0 | 0 |
| 4 | 1 | 1 | 0 | 0 | 0 |
| 5 | 0 | 0 | 1 | 0 | 0 |
| 6 | 1 | 0 | 1 | 0 | 0 |
| 7 | 0 | 1 | 1 | 0 | 0 |
| 8 | 1 | 1 | 1 | 0 | 0 |
| 9 | 0 | 0 | 0 | 1 | 0 |
| 10 | 0 | 0 | 0 | 0 | 1 |

Figure 7:
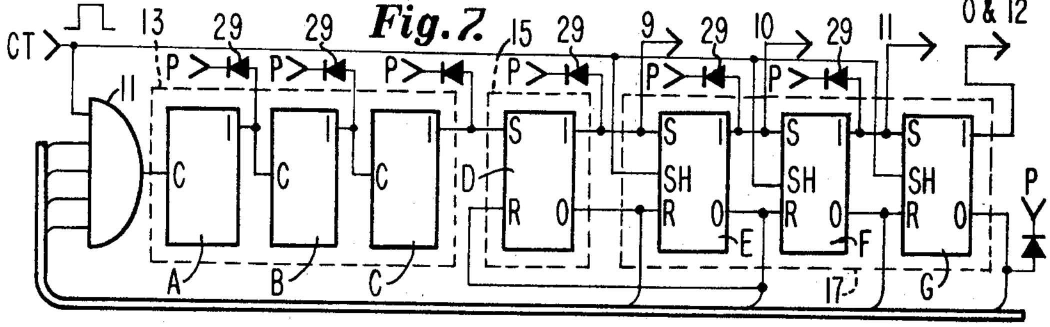
FIG. 7 is a logic diagram of the subject counter in a base twelve configuration.

FIG. 7 further exemplifies the basic form of my counter by illustrating an embodiment having a radix of twelve, which would be particularly useful in calculations in the sterling monetary system. As shown, this counter has the complementing bistable devices A, B, and C in its input binary section 13; the set-reset device D in its interface section 15; and three serially coupled shift register devices E, F, and G in its output section 17. The SH input of each shift register device is directly connected to the source of count pulses and the "0" output of each is coupled back to separate inputs to the AND gate 11. The "0" output of the device E also feeds back to the R input of the device D to provide the section 17 to section 15 reset coupling.

The operation of this counter form is most similar to that of the counter of FIG. 6, except that two additional pulses are receivable by the two additional stages in the output section before the base count status is attained, as shown in the following Table III.

TABLE III

| Pulse Count | Counter Section | | | | | | |
|---|---|---|---|---|---|---|---|
| | Binary | | | Interface | Output | | |
| | A | B | C | D | E | F | G |
| 0 | 0 | 0 | 0 | 0 | 0 | 0 | 1 |
| 1 | 0 | 0 | 0 | 0 | 0 | 0 | 0 |
| 2 | 1 | 0 | 0 | 0 | 0 | 0 | 0 |
| 3 | 0 | 1 | 0 | 0 | 0 | 0 | 0 |
| 4 | 1 | 1 | 0 | 0 | 0 | 0 | 0 |
| 5 | 0 | 0 | 1 | 0 | 0 | 0 | 0 |
| 6 | 1 | 0 | 1 | 0 | 0 | 0 | 0 |
| 7 | 0 | 1 | 1 | 0 | 0 | 0 | 0 |
| 8 | 1 | 1 | 1 | 0 | 0 | 0 | 0 |
| 9 | 0 | 0 | 0 | 1 | 0 | 0 | 0 |
| 10 | 0 | 0 | 0 | 0 | 1 | 0 | 0 |
| 11 | 0 | 0 | 0 | 0 | 0 | 1 | 0 |
| 12 | 0 | 0 | 0 | 0 | 0 | 0 | 1 |

An interchange of data from Tables I and III discloses that, with respect to the base twelve counter of FIG. 7, $m=7$, and $n=3$; therefore, $1+m+1=9$ and $$1+m+1+n=12$$

Accordingly, discrete and non-slivering outputs should be available for the counts of nine through twelve, as verified in FIG. 7, and the counts of twelve and zero should be logically the same, as shown in Table III.

Figure 8:
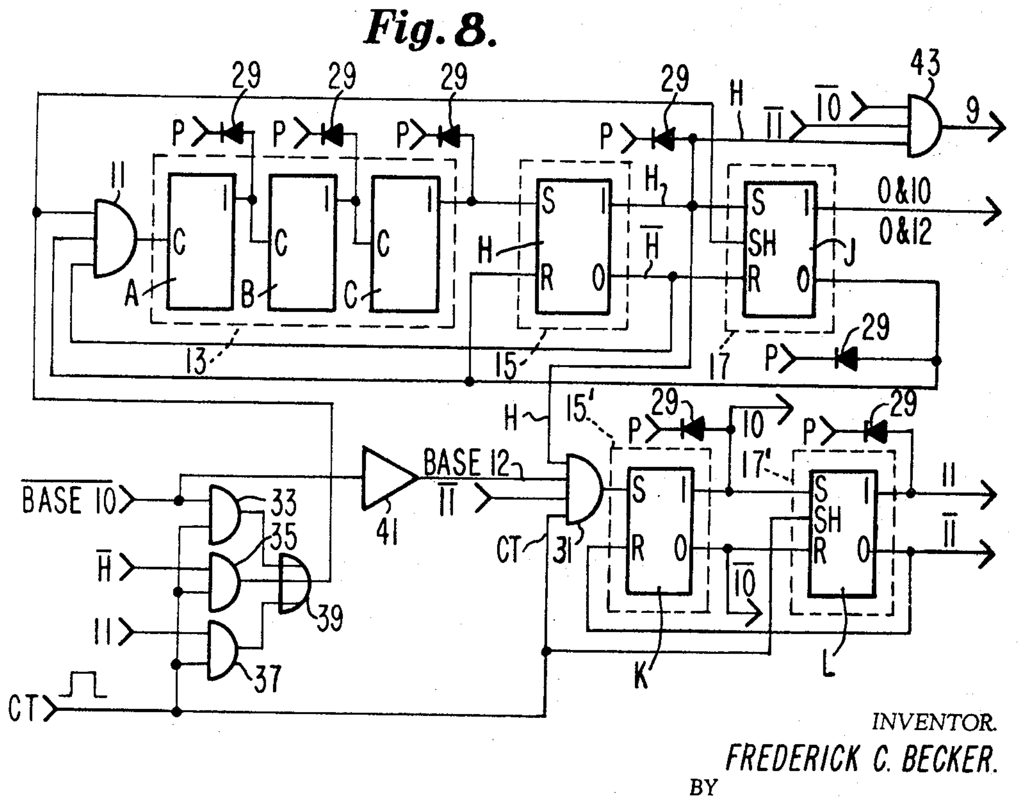
FIG. 8 is a logic diagram of an embodiment of the subject invention which counts in both base ten and base twelve.

FIG. 8 illustrates the second form of my counter circuit, one which is operably switchable from a first radix to any one of a plurality of other radices. This form of counter is logically feasible because the flexibility of the basic counter permits the basic interface section 15 to be separated from the basic output section 17 by the combination of a supplemental interface section 15' and a supplemental output section 17'.

Subsequent to the plurality of count pulses which first set the input section 13 to (1) and then the interface section 15 to (1), the next or supplemental plurality of pulses are gated by an input steering network to a logically interposed pair of supplemental sections 15' and 17'. After the latter are sequentially set to (1) in a manner similar to their basic counterparts, the remaining count pulses are gated to the basic output section 17, which thereupon assumes the unique (1) state upon receipt of the trailing edge of the radix count pulse.

FIG. 8 illustrates, for example, an especially simple embodiment of the second form of my counter. The supplemental interface section 15' houses a set-reset bistable device K and the supplemental output section 17' houses a single shift register device L. Obviously the output section 17' could house a plurality of serially coupled shift register devices for stages. Also, a plurality of pairs of supplemental counting sections could be provided and switchably coupled between the basic interface and output sections in a manner similar to that next to be described. Whenever there is a plurality of pairs of supplemental sections, the output section of each would have a different number of stages.

The bistable devices A, B, C, H and J, located in the upper part of FIG. 8, form the minimum radix portion of that counter. For example, these devices are coupled to form a radix ten counter and therefore have the same counting section and stage configuration as the radix ten counter in FIG. 6. The device H and J are equivalent to the devices D and E in FIG. 6. The supplemental sections 15' and 17', by housing one bistable element each, the devices K and L, provide means for increasing the minimum radix by two units. Accordingly, the addition of the supplemental counter sections 15' and 17' enables this counter embodiment to operate in both base ten and base twelve and thereby be especially useful in performing calculations in both the decimal and sterling systems.

In addition to the primary input AND gate 11 and the counting sections 13, 15, 15', 17, and 17', this simple form of multibase counter, which is switchable between two radices, has an auxiliary input AND gate 31 and an input steering network. As shown, the auxiliary AND gate 31 has four input terminals for receiving the following enabling-inhibiting signals: the CT pulses; a Base 12 radix selecting level, defined below; an H signal level, which originates from the "1" output of the bistable device H; and a $\overline{\text{H}}$ signal level, which is transmitted from the "0" output of the device L. The output from the auxiliary input AND gate 31 is connected to the S input of the supplemental interface section 15', so that when enabled, it sets that device to (1).

The input steering network comprises three count discriminating and radix selection AND gates 33, 35, and 37 and a signal inverter 41. As shown, terminals of these elements are coupled to both of the input AND gates 11 and 31 as well as the output sections 17 and 17'. As next to be explained, the steering network selectively couples the CT pulses to these locations. The inverter 41 selectively provides an inhibiting signal to the auxiliary AND gate 31 when only the primary input AND gate 11 is to be employed in a complete counting routine. The steering AND gates feed into a common OR gate 39, the output of which is coupled to an input of the primary input AND gate 11 and supplies the pulses to be counted in much the same manner as the CT input line in FIG. 1. However, in this embodiment, the CT input is connected to one of the inputs of each of the steering AND gates 33, 35, and 37.

To utilize the minimum radix designed into a particular multiradix counter, such as the radix ten in the FIG. 8 embodiment, a radix selecting source, not shown, applies a high signal level to the other input of AND gate 33. With respect to this specific embodiment, this high level may be logically termed Base 10 or $\overline{\text{Base 12}}$; the former is employed in FIG. 8. The coincidence of a high Base 10 level and a count pulse to the AND gate 33 enables the transmission of the first ten count pulses via the OR gate 39 to the primary AND gate 11. The fact that an enabling high $\overline{\text{H}}$ input is applied to the AND gate 35 for the first nine count pulses is of no logical significance. The high Base 10 radix selecting level is also applied to the input of the inverter 41 which produces as its output a low signal level that is applied to the auxiliary AND gate 31 and thereupon inhibits that gate. The count pulses are also applied directly to the SH input of the device L in the supplemental output section 17′; however, the first ten pulses do not cause that device to switch to the (1) state since the necessary preconditioning inputs from the section 15′ are not present. Hence, the supplemental counting sections 15′ and 17′ are isolated from the count pulses during the entire base ten counting routine, which proceeds in the same manner as described with respect to Table II and the counter in FIG. 6.

As previously discussed, there are pullover diodes 29 coupled to at least one switching element of each of the bistable devices in each of the counter sections. In the arrangement shown in FIG. 8, an initial restore or preset pulse is applied to each diode 29 via an input P to thereupon condition its associated bistable device, as shown in line one of Table IV set forth below. This presetting is logically the zero count condition; however, proper steering of the preset pulse to the bistable devices could enable the counter to be set initially to any desired count position.

TABLE IV

| Pulse Count | Counter Section | | | | | | |
|---|---|---|---|---|---|---|---|
| | Binary | | | Interface | | Output | |
| | A | B | C | H | K | L | J |
| 0 | 0 | 0 | 0 | 0 | 0 | 0 | 1 |
| 1 | 0 | 0 | 0 | 0 | 0 | 0 | 0 |
| 2 | 1 | 0 | 0 | 0 | 0 | 0 | 0 |
| 3 | 0 | 1 | 0 | 0 | 0 | 0 | 0 |
| 4 | 1 | 1 | 0 | 0 | 0 | 0 | 0 |
| 5 | 0 | 0 | 1 | 0 | 0 | 0 | 0 |
| 6 | 1 | 0 | 1 | 0 | 0 | 0 | 0 |
| 7 | 0 | 1 | 1 | 0 | 0 | 0 | 0 |
| 8 | 1 | 1 | 1 | 0 | 0 | 0 | 0 |
| 9 | 0 | 0 | 0 | 1 | 0 | 0 | 0 |
| 10 | 0 | 0 | 0 | 1 | 1 | 0 | 1/0 |
| 11 | 0 | 0 | 0 | 1 | 0 | 1 | 0 |
| 12 | 0 | 0 | 0 | 0 | 0 | 0 | 1 |

The preset pulse is also coupled via the inputs P and the diodes 29 to the bistable devices K and L respectively housed in the supplemental interface and output sections 15′ and 17′. Although not shown in FIG. 8, it may be found desirable to couple the output from the inverter 41 to the pullover diodes associated with the devices K and L so that the preset pulse need not be applied to the counter when it is switched from the base ten to the base twelve modes at a time just after the base of ten; i.e., zero, has been attained. Such pullover diode coupling would insure a proper base twelve preset status.

Counting in the base twelve mode is enabled by the application of a low or $\overline{\text{Base 10}}$ signal from the radix selecting source to the inverter 41 and to an input of the AND gate 33. The high or Base 12 output from the inverter removes the previously applied block to the auxiliary input AND gate 31; whereas, the low $\overline{\text{Base 10}}$ signal inhibits the AND gate 33. The first nine of twelve pulses are transmitted through the AND gate 35, which has its other input coupled to the then high "0" or $\overline{H}$ output line of the device H in the interface section 15. These first nine count pulses are then coupled through the OR gate 39 to the primary input AND gate 11 and thereupon progressively to the bistable devices A, B, C, and H, as shown in lines two through ten of Table IV. This operation, as reflected in Table IV, is the same as that depicted in the same lines of Table II with respect to the devices A, B, C, and D of the counter in FIG. 6. The device J in the output section 17 remains in the (0) state, because its S input is low and its R input is high until the trailing edge of the ninth pulse. Although the Base 12, $\overline{11}$, and CT inputs to the auxiliary AND gate 31 are high during this time, that gate is inhibited since its H input remains low until the trailing edge of the ninth count pulse.

Upon the application of the tenth pulse to be counted, the three steering AND gates 33, 35, and 37 are all inhibited, because of low inputs to their Base 10, $\overline{H}$, and 11 inputs respectively. Accordingly, the OR gate 39 does not receive that pulse for transmission to the primary AND gate 11 and to the SH input of the output device J. For this reason, the bistable devices A, B, C, H, and J are isolated from the source of count pulses and remain in the same state as they were at the end of the ninth pulse, as shown by a comparison of the tenth and eleventh lines of Table IV. Also, as emphasized in line eleven of Table IV by the split notation of the state of the output device J, during the tenth count pulse that device is switched to the (1) state only in the base ten counting mode, but remains in the (0) state in the base twelve counting mode.

During the application of the tenth count pulse the auxiliary AND gate 31 is enabled since its H signal input became high in response to the trailing edge of the ninth pulse. Thus, the tenth count pulse is transmitted from the CT line through the AND gate 31 and into the set-reset bistable device K in the supplemental interface section 15′. Upon the passage of the trailing edge of that tenth pulse, the device K is set to the (1) state. The device L in the supplemental output section 17′ remains in the (0) state since, during the application of this tenth pulse, its inputs are not properly preconditioned.

Although both of the devices H and K in the interface sections 15 and 15′ are in the (1) condition upon the termination of the tenth count pulse, a tenth pulse count signal from the counter may be obtained directly and discretely from the "1" output of the device K, as shown in FIG. 8, since the only time that output is high is at the count of ten.

The counter responds to the eleventh input pulse in a similar manner. The AND gate 11 and the counter sections 13, 15, and 17 do not receive that pulse and their bistable devices remain in the same status as during the receipt of the ninth and tenth count pulse. Although the auxiliary AND gate 31 is enabled and transmits the eleventh pulse to the S input of the bistable device K, that device is already set and is not thereby influenced to change state. The SH input of the device L also receives the eleventh count pulse which causes that device to become set to (1) since its S and R inputs became properly conditioned upon the setting of (1) of the device K during the receipt of the trailing edge of the tenth pulse. The "0" output of the device L goes low upon the setting of that device and feeds back to the R input of the device K a change of energy level which induces the device K to become reset to (0).

As shown in Table IV, the device L is in the (1) state only upon the count of eleven; therefore, a high signal from its "1" output is indicative of that count, notwithstanding the fact that the "1" output of the device H remains high. Accordingly, in response to the two interposed or supplemental counts of ten and eleven, the logically interposed pair of supplemental counting sections receive those count pulses and become set to (1).

Since the set-reset device H goes high in response to the ninth count pulse and remains high during the tenth and eleventh pulses, at which times the devices K and L go high respectively, to obtain a ninth count representing signal output from the counter it is necessary to gate by an AND gate 43 the $\overline{10}$ and $\overline{11}$ outputs from the devices K and L with the "1" output of the device H. This gated output is not subject to slivering at the count of nine, since at that count only the device H is changing state. The necessity for gating the "1" output of the device H to obtain the nine count output from the counter, does not affect the application of the H and $\overline{H}$ inputs to the AND gates 31 and 35.

The twelfth count pulse is met by a unique set of input conditions. That pulse is coupled to the auxiliary AND gate 31 via the CT line; however, the $\overline{11}$ input signal from the "0" output of the device L, which is in the (1)

state, is low, inhibits that gate, and prevents the switching of the device K from its (0) state. Since the device K is held in the (0) state, its output levels precondition the S and R inputs of the device L such that, upon the application of the trailing edge of the twelfth pulse to the SH input of that device via the CT line, the shift register device L becomes reset to (0), as shown on the bottom line of Table IV.

Inasmuch as the "1" output of the device L is high only during the application of the twelfth pulse, the steering AND gate 37, which has the 11 count signal as its second input, is enabled only for the twelfth count pulse and, via the OR gate 39, couples that pulse to the primary AND gate 11 as well as the SH input of the shift register device J. However, the AND gate 11 is inhibited by the application of the low "0" output from the set device H. Since the device H is in the (1) state, and the output bistable device J is in the (0) state upon the application of the twelfth pulse, the device J is preconditioned to be set to (1) by the trailing edge of the twelfth pulse into its SH input and is so set, as shown on the bottom line of Table IV.

Once again, the radix and zero counts are logically the same and only the bistable device J, which is the only bistable device in the basic output section 17 and therefore is also the last bistable device in that section, is in the (1) state at those count times. The fact that the device J is set to (1) for both the radix counts of ten and twelve as well as zero further verifies the cyclical nature and the multibase flexibility of my counter.

Obviously, the multibase flexibility is not limited to switching between only two bases as above described. Proper input pulse steering, radix selection, and the use of additional pairs of supplemental counting sections will provide a counter capable of switching to numerous bases with ease and logical assurance.

If the symbol $q$ were employed to represent the sum of the supplemental counts insertable into the counting routine during the logical insertion of a pair of supplemental interface and output sections, and $q$ also represented the simple sum of set-reset device in the supplemental interface section 15' and the number of shift register stages in the supplemental output section 17', then $q=1+n'$ would be the proper term to be inserted into the previously established radix counting stage formula $$1+m+1+n$$

Hence, the equation $1+m+1+n+q$ represents the relationship between the radix and the number of stages in each section of both forms of my counter wherein: $m$ equals the storage maximum of the input section 13, be it binary or otherwise; $1+m$ designates the pulse count at which the storage maximum of the input section 13 is attained; the second occurrence of the digit 1 represents the uni-staged basic interface section 15; $q$ equals the sum of the counts insertable by a supplemental pair of interface and output sections; and more particularly, $q=1+n'$, in which the 1 represents the uni-stage supplemental interface section 15' and $n'$ designates the number of shift register devices in the supplemental output section 17'; and finally, $n$ denotes the number of stages in the basic output section 17.

From the foregoing it will be seen that an efficient and logically unique digital counter has been provided for accomplishing all of the objectives and advantages of this invention. While the fundamental novel features of this counter have been shown and described with reference to specific logic elements and counting radices, it will be apparent to those skilled in the art that variations may be made therein without departing from the spirit of the invention.

I claim:

1. A counter comprising:

first, second and third types of counting sections each housing a different form of settable counting stage, an inhibitable input gate connectable between a source of count pulses and said first counting section, said second counting section coupled between said first and third counting sections, said second and third counting sections coupled back to said input gate for selectively inhibiting the gate, said third counting section also coupled back to said second counting section for selectively setting the counting stage therein and also connectable to the source of count pulses, and output means discretely coupled to said second and third counting sections providing numerically consecutive, non-slivering outputs therefrom.

2. A cyclical pulse counter of variable radix for counting of pulses from a source of pulses to be counted, comprising:

three cascaded counting sections each including at least one settable bistable circuit of a form different from that of the other two sections and having at least one input terminal and one output terminal, a logic gate between said source of pulses to be counted and an input terminal of the first counting section and having at least two additional input terminals connected to receive inhibiting signals supplied thereto back from said second and third counting sections, said third counting section operable to receive pulses from said source of pulses and supplying an output to an input of said second counting section, and presetting means coupled to said counting sections, presetting all but one of the bistable circuits therein to a similar one of their states in a zero count position, said counter attaining a radix count position in response to a predetermined number of count pulses, the radix and zero count positions being logically the same.

3. A cyclical pulse counter of variable radix comprising:

a plurality of serially connected bistable devices of a first form, a bistable device of a second form, a plurality of serially connected bistable devices of a third form via the bistable device of the second form, a logic gate connectable between a source of pulses to be counted and an input to the serially first of said first form of bistable device, said logic gate having inhibiting inputs coupled to outputs from the second and third forms of bistable devices, each bistable device of said third form having an input connectable to the source of pulses, means coupling an output of the serially first of said third form of bistable device to an input of said second form of device, and bistable device presetting means coupled to each said device and setting all but one of them to a similar one of their states in a zero count position, said counter, in response to any predetermined number of count pulses, attaining a radix count status which is logically the same as the zero count position.

4. A digital counter having a predeterminable radix comprising:

an input section having an input and an output, an interface section having a pair of inputs and a pair of logically opposite outputs, said output from said input section being coupled to one of said inputs of said interface section, an output section having a trio of inputs and a pair of logically opposite outputs, said two outputs from said interface section being coupled respectively to two of the inputs of said output section, one of said outputs of said output section being coupled back to the other input of said interface section, one of the outputs of the interface section and said other output of the output section providing logically positive, non-slivering, digit representing signals, said output section providing one such signal upon the attainment of the counter radix, and
an input logic gate having a plurality of inputs and an output,
the output of said gate being coupled to the input of said input section,
one of the inputs of said gate being connectable to a source of pulses to be counted,
the third input of said output section also being connectable to the source of pulses,
the other inputs of said logic gate being coupled respectively to said one output of said output section and to the other output of said interface section.

5. A digital counter according to claim 4 wherein:
said input section comprises at least one complementing form of bistable device,
said interface section comprises a set-reset form of bistable device having logically positive and negative outputs, and
said output section comprises at least one shift register form of bistable device having logically positive and negative outputs,
said logically positive outputs providing a plurality of numerically consecutive, non-slivering, digit representing signals, the serially last of which represents the radix count.

6. A digital counter according to claim 5 wherein:
said output section includes a plurality of said shift register devices each of which has a shift input, the serially first of which being said third input of said output section,
each of said shift inputs being connectable to the source of pulses, and
each one of the logically negative outputs from said shift register devices being coupled back to inputs of said input gate and inhibiting that gate whenever at least one of those shift register devices is logically positive.

7. A pulse counter for counting pulses from a source of pulses to be counted, comprising:
first, second, and third types of counting sections each including a different form of bistable settable device and having at least one input terminal and one output terminal,
said third counting section including a plurality of cascaded bistable settable devices of its respectively characterized form each having a plurality of input terminals and output terminals,
an inhibitable gate having an input terminal connectable to said source of pulses and having an output terminal connected to an input terminal of said first counting section,
said gate having a plurality of additional input terminals one of which is connected to an output terminal of said second counting section and the remaining to a corresponding different output terminal of each bistable settable device of said third counting section,
means connecting an output terminal of said first section to an input terminal of said second counting section and connecting an output terminal of said counting section to an input terminal of said third counting section,
means connecting an output terminal of the first one of said bistable settable devices of said third counting section to another input terminal of said second counting section, and
output means discretely coupled to and taken from an output terminal of said second counting section and from an output terminal of each one of said bistable settable devices of said third connecting section.

8. A digital counter characterized by the variable radix-counting stage formula $1+m+1+n$, said counter comprising:

an input gate connectable to a source of pulses to be counted,
an input counting section coupled to the output of said gate and housing at least one counting stage of a first form,
said input section having an $m$ count pulse storing capacity and attaining said capacity upon the receipt of a $1+m$ quantity of count pulses,
an interface counting section housing one counting stage of a second form and having a pulse storing capacity of 1, and
an output section serially coupled to said input section via said interface section,
said output section housing an $n$ quantity of counting stages of a third form and having a count pulse storing capacity of $n$.

9. A digital counter according to claim 8 further including:
counting stage presetting means coupled to each said stage and selectively presetting the counter to any count representing condition from zero to the radix condition,
means coupling said output section back to said interface section and also coupling those two sections back to said input gate, and
logic equating means including said coupling means controlling said gate and the setting of the interface stage and rendering the zero and radix count conditions logically the same.

10. A digital counter according to claim 9 wherein:
each said counting stage comprises a bistable device,
each counting stage of the first form comprises a bistable device of the complementing form rendering the input section a binary counting section, and
the bistable devices in said interface and output sections possess logically positive outputs which provide consecutive, non-silvering digital indications for the pulse counts of $1+m+1$ through the radix count of $1+m+1+n$ inclusive.

11. A digital counter switchable between a plurality of radices comprising:
a first type of counting section,
a plurality of settable counting sections of a second type,
a plurality of settable counting sections of a third type,
means intercoupling said second and third pluralities of counting sections and forming a plurality of ordered pairs of counting sections, each pair comprising one of each of said second and third types of sections,
said first counting section coupled to the first of said ordered pairs, and
switching means connectable to a source of count pulses and selectively coupled to said first counting section, the first of said ordered pairs of sections, and to a predetermined other one of said pairs for the transmission thereto of count pulses.

12. A counter according to claim 11 wherein:
said switching means includes separately enabled input gates,
one of said gates has an output coupled to said first counting section,
other of said gates each have an output respectively coupled to one of said ordered pairs of sections, other than the first in the order,
said one input gate is coupled to and inhibited by said first ordered pair of sections, and
said other input gates are respectively coupled to and inhibited by the counting section of the third type in their associated pair of sections as well as the counting section of the second type in the first ordered pair.

13. A counter according to claim 12 wherein:
said switching means further includes pulse steering logic having a plurality of input and output terminals,
one of said input terminals being connectable to the source of count pulses, another of said input terminals being connectable to a radix selecting means,
a first of said output terminals being connected to said one input gate and also directly to said first ordered pair,
a second of said output terminals being connected to a selectable one of said other input gates, and
a third of said output terminals being connected both to said other input gates and to each of said other pairs,
said gates being enabled at mutually exclusive times, the second counting section of said first pair being set prior to the setting of any other section in any of the pairs, and only the third counting section of said first pair being set in response to the radix count pulse.

14. A counter according to claim 11 wherein:
at least one bistable device of a first form is housed exclusively in said first counting section,
one bistable device of a second form is housed exclusively in each of said counting sections of the second type,
at least one bistable device of a third form is housed exclusively in each of said counting sections of the third type,
each of said third type of counting sections, other than that in the first ordered pair, houses a different number of the same form of bistable devices,
said types of counting sections are respectively input, interface, and output,
said forms of bistable devices are respectively complementing, set-reset, and shift register, and
said set-reset and said shift register devices having logically positive outputs which produce non-slivering, successive digit representing signals upon receipt by the counter of the radix count pulse and a plurality of successive count pulses therebefore.

15. A multiradix pulse counter for counting pulses from a source of count pulses in a radix determined by a radix prescribing means comprising:
a counting section of a first type,
an ordered plurality of counting sections of a second type,
an ordered plurality of counting sections of a third type,
the initial counting section of said second type serially coupling said first type of counting section to the initial counting section of said third type,
the remaining counting sections of said second and third type being intercoupled with respect to their order positions,
first pulse gating means coupled to an input of said counting section of the first type,
second pulse gating means preconditionable and selectively coupleable to an input of each of said second type of counting section, other than initial one,
logic means connectable between the source of count pulses, the radix prescribing means, and said gating means, and
gating enabling means coupling said second and third types of counting sections to said gating means,
said logic means having a first portion responsive to the count pulses and the radix prescribing means and coupling count pulses to said first pulse gating means,
said logic means having a second portion responsive to the radix prescribing means, preconditioning said second pulse gating means, and selectively coupling it to one of said second types of counting sections,
said gating enabling means and said logic means intercoupled with said pulse gating means and allowing only one of them to gate any particular count pulse.

16. A multiradix pulse counter characterized by the radix-counting section formula $1+m+1+n+q$, said counter comprising:
pulse steering logic connectable to a source of pulses to be counted,
pulse gating means coupled to said steering logic and connectable to the pulse source,
an input counting section coupled to said gating means and selectively receiving counting pulses therethrough,
said input section having a variable pulse count capacity of $m$ and attaining that capacity upon receipt of the $1+m$ valued count pulse,
a basic interface section having a pulse capacity of 1,
a basic output section serially coupled to said input section via said basic interface section and having a variable pulse capacity of $n$, and
a supplemental pair of intercoupled interface and output sections, having a pulse capacity of $q$,
said basic interface section being coupled to the supplemental interface section through said gating means,
said supplemental output section being coupled between said steering logic and said gating means, whereby said supplemental section is logically insertable serially between said basic sections for changing the radix of said counter by the pulse count value of $q$.

17. A digital pulse counter characterized by the radix-counting stage formult $1+m+1+n+q$ comprising:
a first type of counting section housing at least one counting stage of a first form and attaining a maximum count capacity of $m$ upon receipt of a $1+m$ quantity of count pulses;
a second type of counting section serially coupled to said first counting section, housing only one counting stage of a second form, and having a count capacity of 1;
a third type of counting section serially coupled to said second counting section, housing an $n$ number of serially connected counting stages of a third form, and having a count capacity of $n$;
a multiconditioned switching means connectable to a source of count pulses;
first count pulse gating means coupled between outputs from said second and third counting sections and an input of said first counting section and controlling the transmission of count pulses into said first counting section;
at least one additional pair of counting sections of said second third types, housing a $q$ number of serially connected stages, having a count capacity or $q$, and selectively coupled to be switchably interposed between said earlier mentioned second and third counting sections; and
second count pulse gating means coupled between an output from the third type of counting section in each said pair, an output from said earlier mentioned second counting section, and an input of said second counting section in each respective pair and controlling the transmission of count pulses into each said pair of counting sections;
said multiconditioned switching means coupled to said gating means selectively coupling count pulses to said first gating means, and selectively preconditioning said second gating means for transmission of count pulses;
said second gating means being directly connectable to the source of count pulses; and
said selective coupling and preconditioning of said gating means enabling only one of them to transmit any particular count pulse.

18. A digital pulse counter according to claim 17 further comprising:
means coupling the count pulses to the counting stage of said third form independent of said gating means,
the coupling between said second and third types of counting secitons and the connecting between the stages of said third form selectively enabling only one of those stages for receipt of any particular count pulse, and output means supplied from the counting stage of said second and third forms, the output means supplied by the serially last of the stages in said earlier mentioned counting section of the third type providing a unique, non-slivering, radix count, signal, the remaining output means providing discrete, sequential, and non-slivering signals prior to said radix count signal.

19. A digital pulse counter according to claim 18 further including:

counting stage presetting means coupled to each stage for presetting the counter to any count representing condition, and intercoupling means relating each third counting section back to its serially coupled second counting section, whereby the logical state of the counter when it produces the radix count signal and when it is preset to a zero count condition is the same.

References Cited

UNITED STATES PATENTS

| | | | |
|---|---|---|---|
| 3,219,805 | 11/1965 | Wolfington | 328—42 X |
| 3,274,498 | 9/1966 | Jones | 328—42 |
| 3,333,116 | 7/1967 | Locasale | 307—88.5 |
| 3,341,693 | 9/1967 | Hurst. | |

MAYNARD R. WILBUR, *Primary Examiner.*

G. MAIER, *Assistant Examiner.*